(12) United States Patent
Fedigan

(10) Patent No.: US 7,345,600 B1
(45) Date of Patent: Mar. 18, 2008

(54) ASYNCHRONOUS SAMPLING RATE CONVERTER

(75) Inventor: Stephen J. Fedigan, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 3 days.

(21) Appl. No.: 11/371,597

(22) Filed: Mar. 9, 2006

Related U.S. Application Data

(60) Provisional application No. 60/660,372, filed on Mar. 9, 2005.

(51) Int. Cl.
*H03M 7/00* (2006.01)

(52) U.S. Cl. ...................................................... 341/61

(58) Field of Classification Search ................ 341/50, 341/61, 63
See application file for complete search history.

(56) References Cited

U.S. PATENT DOCUMENTS

| | | | | |
|---|---|---|---|---|
| 6,057,789 A | * | 5/2000 | Lin | 341/61 |
| 7,167,112 B2 | * | 1/2007 | Andersen et al. | 341/61 |
| 2002/0105448 A1 | * | 8/2002 | Freidhof | 341/61 |
| 2002/0190880 A1 | * | 12/2002 | McLaughlin et al. | 341/61 |

* cited by examiner

*Primary Examiner*—Brian Young
(74) *Attorney, Agent, or Firm*—W. James Brady, III; Frederick J. Telecky, Jr.

(57) ABSTRACT

Asynchronous sampling rate converter with input/output frequency ratio estimation and polyphase filtering uses FIFO level feedback to adaptively control frequency ratio estimation.

7 Claims, 6 Drawing Sheets

ASYNCHRONOUS SAMPLING RATE CONVERTER

CROSS-REFERENCE TO RELATED APPLICATIONS

This application claims priority from U.S. provisional patent application No. 60/660,372, filed Mar. 9, 2005.

BACKGROUND OF THE INVENTION

The invention relates to electronic devices, and, more particularly, to circuitry and methods for conversion of sampling rates of digitally sampled data.

Audio systems currently are required to handle data with various sampling rates, from low rates found in many .WAV files such as 8 kHz to high rates of consumer audio equipment such as 48 kHz. Audio is a key feature of PC multimedia with system requirements approaching those of consumer high fidelity systems for a fraction of the cost. For example, the PC 2001 specification sets high quality audio requirements to play out audio streams at 44.1 and 48 kHz rates. A hardware vendor may choose to supply a codec that only supports 48 kHz. In this case, sample rate conversion between 44.1 and 48 kHz is needed.

T. Ramstad, Digital Methods for Conversion between Arbitrary Sampling Frequencies, 32 IEEE Tr.ASSP 577 (1984) presents a general theory of filtering methods for interfacing time-discrete systems with different sampling rates. This includes time-varying filter coefficients derived as various interpolations samples of a windowed ideal impulse response function. And U.S. Pat. No. 6,141,671 discloses an asynchronous sampling rate converter with the time-varying filter coefficients as linear interpolations of samples of a windowed ideal impulse response function plus input/output clock tracking by comparisons to a master high frequency clock.

However, the known sampling rate converters have computational complexity or clock jitter sensitivity.

SUMMARY OF THE INVENTION

The present invention provides a digital sampling rate converter using windowed impulse response filtering with input/output frequency ratio estimation adapting to buffer fullness.

DESCRIPTION OF THE PREFERRED EMBODIMENTS

1. Overview

Figure 1A:
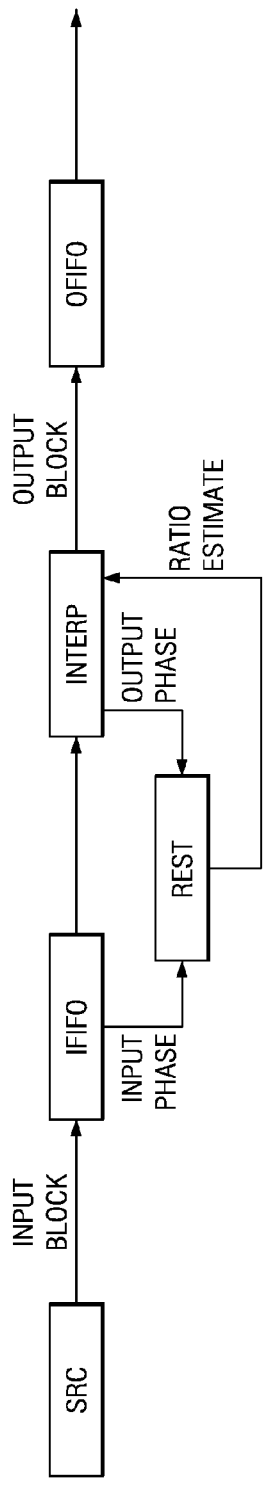
FIGS. 1a-1b are a block diagram and timing diagram.
Figure 1B:
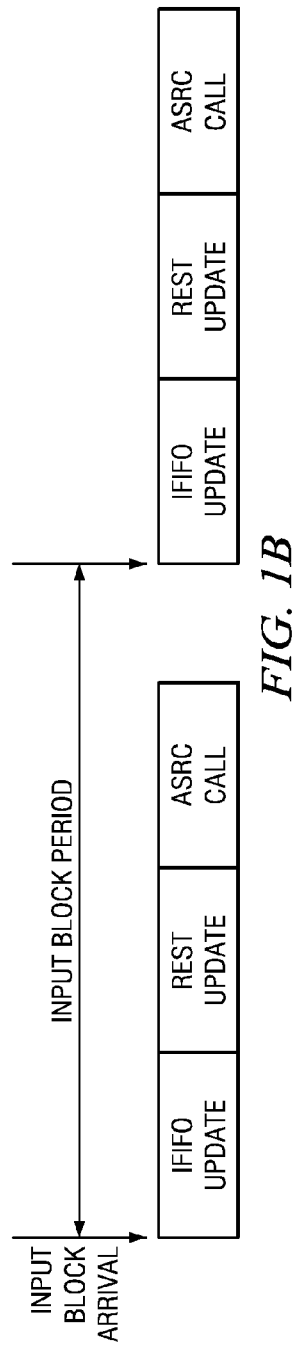

Preferred embodiment methods provide digital Asynchronous Sample Rate Converters (ASRCs) without analog domain intermediates by using an adaptive frequency ratio estimation and polyphase interpolation filter. FIGS. 1a-1b illustrate the functional blocks and operation timing of a preferred embodiment implementation with the ratio estimation in block REST and the interpolation in block INTERP. The ratio estimator uses buffer fullness adaptively.

Preferred embodiment systems (e.g., digital audio players, personal computers with multimedia capabilities, et cetera) perform preferred embodiment methods with any of several types of hardware: digital signal processors (DSPs), general purpose programmable processors, application specific circuits, or systems on a chip (SoC) such as combinations of a DSP and a RISC processor together with various specialized programmable accelerators such as for FFTs and variable length coding (VLC). For example, the 55x family of DSPs from Texas Instruments have sufficient power. A stored program in an onboard or external (flash EEP)ROM or FRAM could implement the signal processing. Analog-to-digital converters and digital-to-analog converters can provide coupling to the real world, modulators and demodulators (plus antennas for air interfaces) can provide coupling for transmission waveforms, and packetizers can provide formats for transmission over networks such as the Internet.

2. Sampling Rate Conversion with Impulse Response Filtering

In order to describe the preferred embodiments, we first consider the "analog interpretation" of sampling rate conversion. Suppose $x_{in}(n)=x(nT_{in})$ are samples of an audio signal $x(t)$ where $t$ is time, $n$ ranges over the integers, and $T_{in}$ is the sampling period. Presume $x(t)$ is bandlimited to $\pm F_{in}/2$, where $F_{in}=1/T_{in}$ is the sampling rate; then the sampling theorem implies $x(t)$ can be exactly reconstructed from the samples $x(nT_{in})$ via a convolution of the samples with an ideal lowpass filter impulse response:

$$x(t)=\Sigma_n h_{lowpass}(t-nT_{in})x(nT_{in})$$

where $$h_{lowpass}(u)=\sin[\pi u/T_{in}]/(\pi u/T_{in})$$

To resample $x(t)$ at a new sampling rate $F_{out}=1/T_{out}$, we need only evaluate the convolution at $t$ values which are integer multiples of $T_{out}$; that is, $x_{out}(m)=x(mT_{out})$.

Note that when the new sampling rate is less than the original sampling rate, a lowpass cutoff must be placed below half the new lower sampling rate to avoid aliasing.

The convolution can be interpreted as a superposition of shifted and scaled impulse responses: an impulse response instance is translated to each input signal sample and scaled by that sample, and the instances are all added together. Note that zero-crossings of the impulse response occur at all integers except the origin; this means at time $t=nT_{in}$ (i.e., at an input sample instant), the only contribution to the convolution sum is the single sample $x(nT_{in})$, and all other samples contribute impulse responses which have a zero-crossing at time $t=nT_{in}$. Thus, the reconstructed signal, $x(t)$, goes precisely through the existing samples, as it should.

A second interpretation of the convolution is as follows: to obtain the reconstruction at time $t$, shift the signal samples under one fixed impulse response which is aligned with its peak at time $t$, then create the output as a linear combination of the input signal samples where the coefficient of each sample is given by the value of the impulse response at the location of the sample. That this interpretation is equivalent to the first can be seen as a change of variable in the convolution. In the first interpretation, all signal samples are used to form a linear combination of shifted impulse responses, while in the second interpretation, samples from one impulse response are used to form a linear combination of samples of the shifted input signal. This is essentially a filter of the input signal with time-varying filter coefficients being the appropriate samples of the impulse response. Practical sampling rate conversion methods may be based on the second interpretation.

The convolution cannot be implemented in practice because the "ideal lowpass filter" impulse response actually extends from minus infinity to plus infinity. It is necessary to window the ideal impulse response so as to make it finite. This is the basis of the window method for digital filter design. While many other filter design techniques exist, the window method is simple and robust, especially for very long impulse responses. Thus, replace $h_{lowpass}(u)=\sin[\pi u/T_{in}]/(\pi u/T_{in})$ with $h_{Kaiser}(u)=w_{Kaiser}(u)\sin[\pi u/T_{in}]/(\pi u/T_{in})$. In particular, the Kaiser window is given by:

$$w_{Kaiser}(t) = I_0(b\sqrt{(1-t^2/\tau^2)})/I_0(b)$$
$$= 0$$

for $|t| \leq \tau$ otherwise where $I_0(.)$ is the modified Bessel function of order zero, $\tau=(N-1)T_{in}/2$ is the half-width of the window (so N is the maximum number of input samples within a window interval), and b is a parameter which provides a tradeoff between main lobe width and side lobe ripple height.

To provide signal evaluation at an arbitrary time t where the time is specified in units of the input sampling period $T_{in}$, the evaluation time t is divided into three portions: (1) an integer multiple of $T_{in}$, (2) an integer multiple of $T_{in}/K$ where K is the number of values of $h_{Kaiser}(.)$ stored for each zero-crossing interval, and (3) the remainder which is used for interpolation of the stored impulse response values. That is, $t=nT_{in}+k(T_{in}/K)+f(T_{in}/K)$ where f is in the range [0,1). For a digital processor, the time could be stored in a register with three fields for the three portions: the leftmost field gives the integer number n of samples into the input signal buffer (that is, $nT_{in} \leq t < (n+1)T_{in}$ and the input signal buffer contains the values $x_{in}(n)=x(nT_{in})$ indexed by n), the middle field is the index k into a filter coefficient table h(k) (that is, the windowed impulse response values $h(k)=h_{Kaiser}(kT_{in}/K)$ so the main lobe extends to $h(\pm K)=0$), and the rightmost field is interpreted as a fraction f between 0 and 1 for doing linear interpolation between entries k and k+1 in the filter coefficient table (that is, interpolate between h(k) and h(k+1)). As a typical example, K=256; and f has finite resolution in a digital representation which implies a quantization noise of expressing t in terms of a fraction of $T_{in}/K$.

Define the sampling-rate conversion ratio $r=T_{out}/T_{in}=F_{in}/F_{out}$. So after each output sample is computed, the time register is incremented by r in fixed-point format (quantized); that is, the time is incremented by $T_{out}=rT_{in}$. Suppose the time register has just been updated, and an output $x_{out}(m)=x(t)$ is desired where $mT_{out}=t=nT_{in}+k(T_{in}/K)+f(T_{in}/K)$. For $r \leq 1$ (the output sampling rate is higher than the input sampling rate), the output using linear interpolation of the impulse response filter coefficients is computed as:

$$x_{out}(m)=\Sigma_j[h(k+jK)+f\Delta h(k+jK)]x_{in}(n-j)$$

where $x_{in}(n)$ is the current input sample (that is, $nT_{in} \leq mT_{out} < (n+1)T_{in}$), and f in [0,1) is the linear interpolation factor with $\Delta h(k+jK)=h(k+1+jK)-h(k+jK)$.

When r is greater than 1 (the output sampling rate is lower than the input sampling rate), the initial k+f is replaced by (k+j)/r, and the step-size through the filter coefficient table is reduced to K/r instead of K; this lowers the filter cutoff to avoid aliasing. Note that f is fixed throughout the computation of an output sample when $1 \geq r$ but f changes when $r>1$.

The number of zero-crossings stored in the filter table is an independent design parameter. For example, the use of 26 zero-crossings in a system designed for audio quality with 20% oversampling may suffice.

For a given quality specification in terms of aliasing rejection, a tradeoff exists between the number of zero-crossings in the windowed impulse response and sacrificed bandwidth. The lost bandwidth is due to the so-called "transition band" of the lowpass filter. In general, for a given stop-band specification (such as "80 dB attenuation"), lowpass filters need approximately twice as many multiply-adds per sample for each halving of the transition band width.

It is worth noting that a given percentage increase in the original sampling rate ("oversampling") gives a larger percentage savings in filter computation time, for a given quality specification, because the added bandwidth is a larger percentage of the filter transition bandwidth than it is of the original sampling rate. For example, given a cutoff frequency of 20 kHz, (ideal for audio work), the transition band available with a sampling rate of 44.1 kHz is about 2 kHz, while a sampling rate of 48 kHz provides a 4 kHz transition band. Thus, a 10% increase in sampling rate halves the work per sample in the digital lowpass filter.

3. First Preferred Embodiment

A first preferred embodiment provides an Asynchronous Sample Rate Converter (ASRC) designed for implementation on the 55x family of DSPs manufactured by Texas Instruments. Unlike a synchronous SRC, the first preferred embodiment converter can interface two 16-bit audio streams whose sample clocks have arbitrary frequency and phase relationships. There is no need to explicitly program the input and output clock frequencies: a servo loop automatically determines the phase of the output samples with respect to the input samples. This ASRC has sufficient accuracy to support 16-bit audio samples and can handle input sample frequencies ranging from 24.00 to 48.00 kHz and output frequencies from 42.1875 to 48.00 kHz. Since the interpolation filter has a variable cutoff frequency, downsampling can just as easily be performed as upsampling conversion. To facilitate integration, a preferred embodiment has an interface compliant with the XDAIS standard methods mostly written in C, with the exception of the interpolation filter, which is written in assembly to take advantage of the 55x's dual-MAC architecture. The implementation has been designed for a small memory footprint, requiring only 2.7K words of program space and 7.5K words of data space. The MIPs needed to execute vary according to the output sample clock's frequency, ranging from 40 MIPs at 42.1875 kHz to 46 MIPs at 48.00 kHz.

As shown in FIG. 1a, the ASRC has two main components: a ratio estimator and an interpolator. The Ratio ESTimator (REST) determines the frequency and phase relationships between the input and output sample clocks. Using the outputs from the REST and the data from the Input FIFO (IFIFO), the INTERPolator (INTERP) calculates the output sample values. The Output FIFO (OFIFO) buffers the output blocks.

As shown in the event time line of FIG. 1b, during a typical operating cycle, the audio source notifies the ASRC when a new block of input data has arrived, and this data block is entered into the IFIFO. After the data samples are entered, the producer index for the IFIFO is incremented. This index corresponds to the total number of input samples entered into the IFIFO modulo the IFIFO size.

Next, the input phase $\phi_{in}$ is updated. The input phase is the arrival time of the last input sample and is measured relative to the input sample period:

$$\phi_{in} = 2^{16} t_{in} / T_{in}$$
$$= 2^{16} n_{in} \bmod(2^{16} n_{FIFO})$$

where $n_{in}$ is the total number of input samples received. To prevent over-stepping the bounds of the IFIFO, the input phase is always modulo $2^{16} n_{FIFO}$. That is, $0 \le \phi_{in} < 2^{16} n_{FIFO}$. Note that for a typical IFIFO, size $n_{FIFO}=1500$.

Since the input block size is fixed, every time a new input block arrives, the input phase is incremented by:

$$\phi_{in} = \phi_{in} + 2^{16} n_{bin} \bmod(2^{16} n_{FIFO})$$

where $n_{bin}$ is the number of samples in an input block. A typical example block size would be $n_{bin}=1100$.

After updating the IFIFO, the Ratio ESTimator (REST) is called. The REST begins by calculating the phase error, which is defined as $$\phi_{err} = \phi_{in} - \phi_{out}$$

The quantity $\phi_{out}$, the output phase, is defined as:

$$\phi_{out} = 2^{16} t_{out}/T_{in} \bmod(2^{16} n_{FIFO})$$

where $t_{out}$ is the departure time of the most recent output sample. Like the input phase, the output phase is measured relative to the input sample period; however, unlike $t_{in}$, $t_{out}$ is generally not a multiple of $T_{in}$ and the $2^{16}$ multiplicative factor converts the fraction $t_{out}/T_{in}$ into an "integer" portion of the most significant 16 bits and a "fractional" portion of the least significant 16 bits. Note that $\phi_{out}$ specifies the location of each output sample with respect to neighboring input samples, and is an input to the interpolator. The integer portion of the output phase, denoted $\phi_{FIFO}$, specifies the IFIFO index of the closest prior input sample while the fractional portion describes the offset from $\phi_{FIFO}$. Indeed, the output phase will eventually be decomposed into three portions which indicate input samples, filter phases, and spline interpolation coefficients:

$$\phi_{out} = 2^{16} \phi_{FIFO} + 2^5 \phi_{FIR} + \phi_{SPLINE}$$

Based on current and previous phase errors, the REST adjusts its ratio estimate to drive the phase error to zero. By forcing the phase error to zero, the REST ensures that the IFIFO will not underflow or overflow.

After updating the REST, the converter inspects the OFIFO level, and determines how many output samples, $n_{bout}$, the interpolator (INTERP) needs to generate to fill OFIFO; note that contrary to $n_{bin}$, $n_{bout}$ may not be constant. The output phase $\phi_{out}$ and the ratio estimate ř, combined with the IFIFO data, x, are used by the interpolator to calculate the next batch of output values. The interpolator divides $\phi^{out}/2^{16}$ into its integer and fractional portions, a feat which is easily accomplished for numbers in fixed point format by using mask and shift operations. The integer portion ($\phi_{FIFO}$) is the starting data index for the FIR filter in INTERP, and the fractional part specifies the filter phase (of the polyphase filter).

After each output value is calculated by the interpolator, the output phase is incremented by the ratio estimate as follows:

$$\phi_{out} = \phi_{out} + 2^{16} ř (ř = T_{out}/T_{in})$$

to obtain the "location" of the next output sample. If the integer portion of $\phi out/2^{16}$ is incremented by 1, the starting index for the FIR filter data is advanced as well.

Thus after the calculation of the $n_{bout}$ output samples to fill OFIFO, the output phase has been incremented $n_{bout}$ times:

$$\phi_{out} = \phi_{out} + 2^{16} ř n_{bout}$$

At this point, the converter has finished execution for the current cycle (input block), and suspends itself, pending the arrival of the next block of input data as illustrated in FIG. 1b.

Ratio Estimation Method

As previously stated, the REST is responsible for determining the location of each output sample with respect to neighboring inputs. To explain how the REST operates, assume that the input and output samples are uniformly spaced and write the output phase as $$\phi_{out} = 2^{16} n_{out} T_{out}/T_{in}$$
$$= 2^{16} ř\, n_{out}$$

In the long term, the relative difference between the input and output phases will approach zero. The ratio estimator works on this phase balance principle. It compares the input and the output phase. If the phase error is positive (input leads output), the ratio is increased slightly, i.e., $$ř = ř + \epsilon$$

This means that the next time a batch of output samples is generated, the output phase will advance $$\phi_{out} = \phi_{out} + (ř + \epsilon) n_{bout}$$

In the next cycle, if the output phase continues to lag, the ratio will be increased again slightly. If the output phase overtakes the input, the ratio will then be decreased by $\epsilon$. Thus, the ratio estimator continuously works to ensure that the input and the output phase remain in balance.

Besides "learning" the initial ratio between the input and output sample periods, the ratio estimator can adapt to dynamic conditions. If there is a sudden increase in the output sampling rate, more output samples will be transmitted during each input block period, and the output phase will begin to lead the input. The ratio estimator will take corrective action, by continually decreasing the ratio until it re-balances the input and output phases.

To obtain the ratio estimate from the phase error, use an autoregression with the phase error as the inhomogeneous driver:

$$ř_{n+1} = (\tau/[T_{bin}+\tau]) ř_n + (T_{bin}/[T_{bin}+\tau]) K_p \phi_{err}$$

Figure 2:
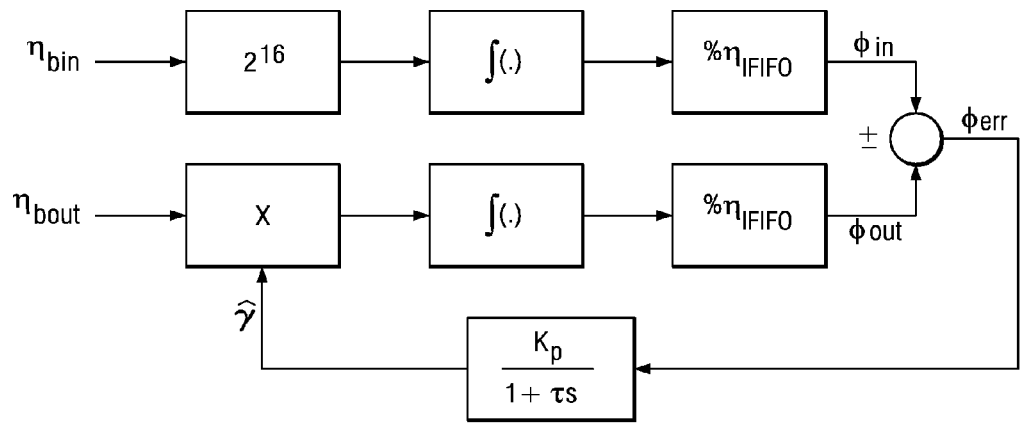
FIG. 2 shows an estimator.

This is a discrete-time version of a classic "lag" filter with gain $K_p$ found in many analog control loops. Due to the presence of the output phase integrator within the control loop, the ratio estimate will have 0 D.C. error; see FIG. 2. However, there will be a D.C. phase error in steady-state, which is determined by the formula:

$$<\phi_{err}> = r_{max}/K_p$$

The D.C. phase error determines the minimum size required for the IFIFO. The FIFO should be at least 10% larger than this, because error in the initial ratio estimate may cause an overshoot condition. The formula suggests that the phase error can be reduced by choosing large gain ($K_p$) values. While true in theory, large gain values also amplify noise, which causes ripple in the ratio estimate, and resulting in phase jitter in the output samples. In addition, large gains will affect the loop stability.

The IFIFO size can also be cut back by reducing the maximum ratio. The time constant in the "lag" compensator is chosen to be large enough to reject noise, but not too large to degrade loop stability. Generally, a critically damped closed-loop system is desired. Parameter values for the current implementation have been chosen to ensure 16-bits of accuracy.

In addition to appropriate parameter values, the REST must be seeded before operation can begin. An initial ratio estimate can be obtained, for example, by the formula:

$$\hat{r}_{init} = n_{clk,in}/n_{clk,out}$$

where $n_{clk,in}$ and $n_{clk,out}$ represent the number of input and output sample clocks counted over a fixed time period by a timer/counter. In some cases, a good starting guess may be known based on nominal oscillator frequencies. Starting with an initial value, the REST can track small changes over time caused by manufacturing tolerances or oscillator drift due to environmental changes. Based on the initial value, a compensator gain $K_p$ is selected according to the linear gain schedule scaled by a selected phase lag $n_{lag}$ $$K_p(\hat{r}) = \hat{r}/n_{lag}$$

This ensures a constant steady-state phase lag throughout the ratio estimator's operating range; a typical phase lag may be 1500 samples. After the gain is selected, the initial output phase is calculated based on the formula:

$$\phi_{out} = \phi_{in} - \hat{r}/K_p$$

Seeding the REST prevents any sort of initial transient which causes transient jitter in the output samples and even temporary under or overflow in the IFIFO.

Figure 3:
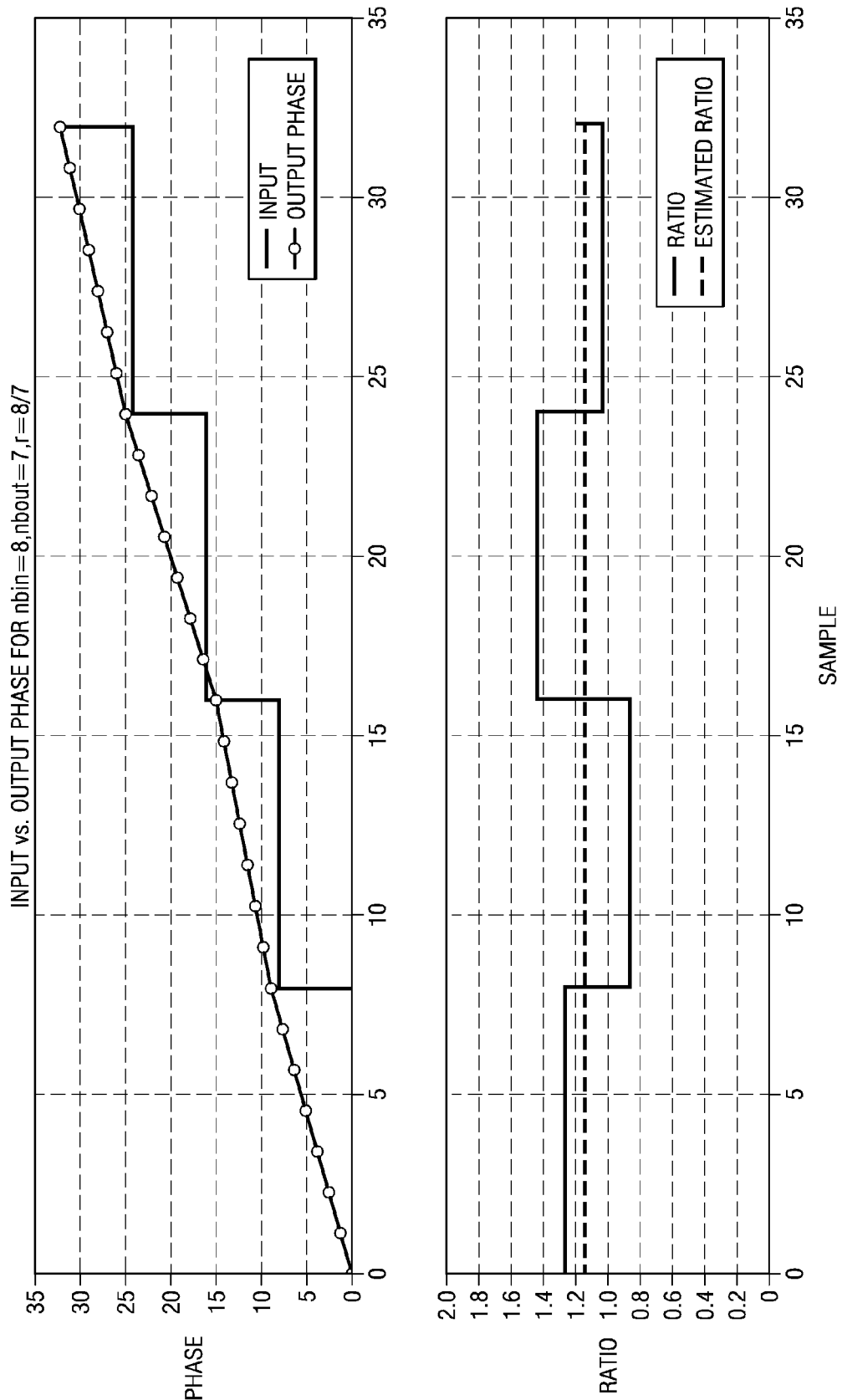
FIG. 3 illustrates output phase and ratio estimation as a function of time.

An example of REST operation is illustrated in FIG. 3, showing how the output phase and ratio estimate evolve over time with $n_{bin}=8$.

Interpolation Method

Figure 4:
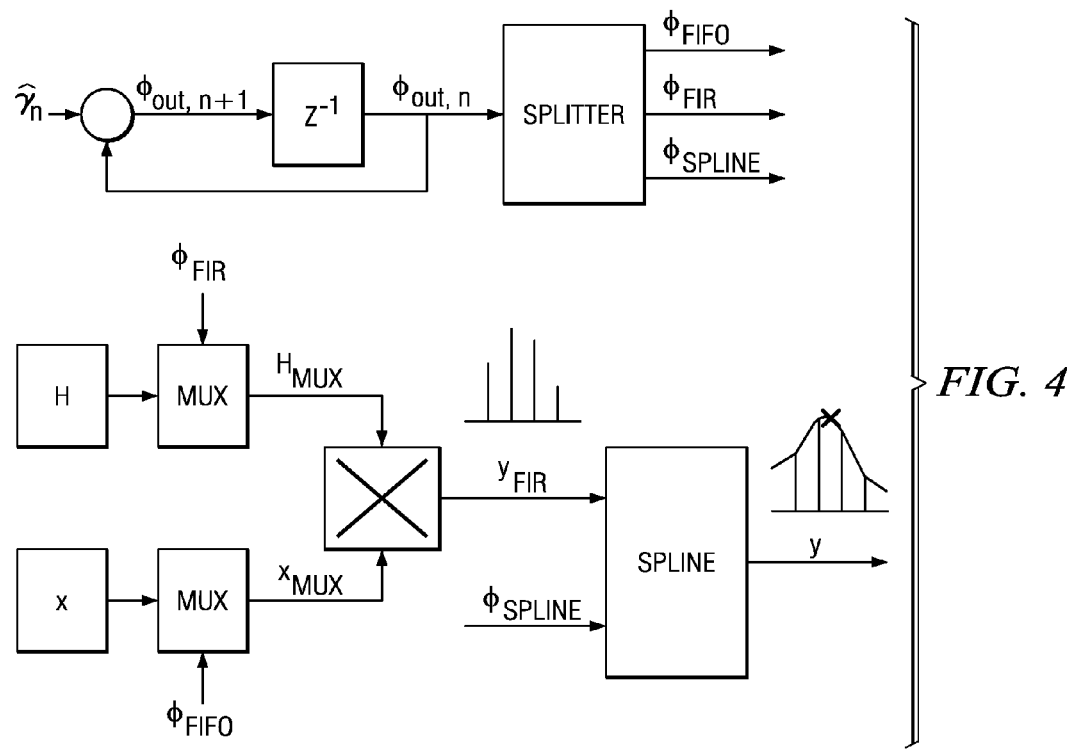
FIG. 4 shows two-tier interpolation.

During a typical cycle, after the ratio estimator is updated, the interpolator is invoked to produce a batch of output samples. To provide a suitable tradeoff between memory usage and MIPs required, the first preferred embodiment uses a two-tiered interpolation scheme as depicted in FIG. 4.

The first tier is a 40-tap, Kaiser-windowed FIR filter which upsamples the input samples by 32×. Coefficients for this filter are calculated using the formula:

$$h[n] = w[n] \sin(\pi f_C n)/\pi n$$

where w[n] is the window and $f_C$ is the cutoff frequency. To avoid calculating unneeded upsamples, a polyphase decomposition of the filter is employed. The coefficients are organized into a 32×40 matrix as follows $$H = \begin{bmatrix} h_{0,0} & h_{0,1} & \cdots & h_{0,39} \\ h_{1,0} & h_{1,1} & \cdots & h_{1,39} \\ \vdots & \vdots & \ddots & \vdots \\ h_{31,0} & h_{31,1} & \cdots & h_{31,39} \end{bmatrix}$$

and only the four closest upsamples to the output sample phase are actually calculated. This requires four different filter phases to be executed on the same input data. For efficient evaluation of these contiguous phases, the operation is formulated as a matrix-vector multiply. Due to boundary conditions, there are four different cases to consider:

| Case | Initial Phase | Procedure |
|---|---|---|
| I | 0 to 28 | Evaluate all four FIR phases with the same input data vector. The coefficient vector does not need to be wrapped around. |
| II | 29 | Evaluate the first 3 phases with the same input data vector, and the last phase with the starting index for the data vector shifted by 1 sample. The coefficient vector pointer is wrapped around for the last phase. |
| III | 30 | Evaluate the first 2 phases with the same input data vector, and the next 2 phases with the input vector shifted by 1 sample. The coefficient vector point is wrapped around for the third phase. |
| IV | 31 | Evaluate the first phase with the original input data vector and the last three phases with the data vector shifted by 1 sample. The coefficient vector pointer is wrapped around for the second phase. |

To reduce pointer arithmetic, circular addressing mode is used to address the input data vector. The vector is size 41. For case I, at the end of each FIR computation, the data pointer is incremented by 1, bringing it back to its starting location. For the special cases (II-IV), the data vector can be shifted 1 sample by incrementing the final pointer value by 2.

Due to the large dynamic range of the filter, 32-bit signed filter coefficients are employed. In the FIR calculation, the 32-bit filter coefficients are multiplied by 16-bit data values. To take advantage of a dual-MAC unit in the FIR computation, each coefficient is split into two signed 16-bit numbers as follows:

$$h_U = (h + 32768) >> 16$$

$$h_L = h - (h_U << 16)$$

Using this approach, the FIR operation can be broken up into two independent summations which are combined at the end in the following manner to obtain the upsamples $y_n$:

$$y_n = \sum h_i x_{n-i}$$
$$= \sum (h_{U,i} << 16 + h_{L,i}) x_{n-i}$$
$$= \left(\sum h_{U,i} x_{n-i}\right) << 16 + \sum h_{L,i} x_{n-i}$$

This allows us to rapidly evaluate the FIR outputs using a dual-MAC architecture while keeping high precision.

Next, these four upsamples, $\{y_{-1}, y_0, y_1, y_2\}$, along with $\Delta$, the distance between the output sample phase and the second upsample, are supplied to a spline interpolator, which performs the calculation:

$$y(\Delta) = -1/6\{\Delta(\Delta-1)(\Delta-2)\}y_{-1} +$$
$$1/2\{(\Delta+1)(\Delta-1)(\Delta-2)\}y_0 -$$
$$1/2\{(\Delta+1)\Delta(\Delta-2)\}y_1 +$$
$$1/6\{(\Delta+1)\Delta(\Delta-1)\}y_2$$

Essentially, this fits a third-order polynomial curve through the four upsampled data points and evaluates the curve at the output sample point. While this expression appears complicated, it can be written more compactly as $y(\Delta)=c_{-1}(\Delta)y_{-1}+c_0(\Delta)y_0+c_1(\Delta)y_1+c_2(\Delta)y_2$
where $$c_{-1}(\Delta)=-\Delta(\Delta-1)(\Delta-2)/6$$

$$c_0(\Delta)=(\Delta+1)(\Delta-1)(\Delta-2)/2$$

$$c_1(\Delta)=-(\Delta+1)\Delta(\Delta-2)/2$$

$$c_2(\Delta)=(\Delta+1)\Delta(\Delta-1)/6$$

To avoid evaluating these polynomial basis functions, a 256-point lookup table is employed with the phase residual $\Delta$ as the table index. After looking up each of the coefficients, the 4-tap FIR filter is evaluated. To reduce the table size, we take advantage of the fact that $$c_{-1}(\Delta)=-c_2(\Delta-1)$$

$$c_0(\Delta)=-c_1(\Delta)-(\Delta+1)(\Delta-2)/2$$

After each output sample is evaluated, the output phase is advanced by the current ratio estimate. Since the number of phases in the FIR filter and the spline are powers of 2, it is a matter of masking and shifting to obtain the next filter and coefficient table index.

Filter Coefficient Calculator

Since the ASRC can be used in downsampling mode over a range of frequency ratios, it is necessary to adjust the cutoff frequency of the FIR filter bank in order to avoid aliasing. To avoid storing a coefficient table for each cutoff frequency of interest, the coefficient table is computed by the DSP. The formula for the coefficients is:

$$h[n]=w_{Kaiser}[n]\ \sin(\pi f_C n)/\pi n$$

From inspection, it is clear that neither the window nor the reciprocal function depends on the cutoff frequency. By defining a modified window function $$w_m[n]=w_{Kaiser}[n]/\pi n$$

we can write $$h[n]=w_m[n]\ \sin(\pi f_C n)$$

The coefficients of this modified window function are stored in a lookup table. Since the sine values are evenly spaced at intervals of $\theta=\pi f_C$, they can be rapidly evaluated for a given cutoff frequency, using the well-known iterative formula $$s_n=2\ \cos(\pi f_C)s_{n-1}-s_{n-2}$$

with the initial conditions $$s_0=0,\ s_1=\sin(\pi f_C)$$

Before the iteration can be started, the coefficient $2\cos(\pi f_C)$ and the initial condition, $s_1=\sin(\pi f_C)$, must be evaluated. To avoid large trig tables, the angle (a 12-bit number which can assume one of 4096 possible values) is expressed as $$\theta=\theta_c+\theta_f+\theta_{vf}$$

where the coarse angle $\theta_c$ represents the first 4 bits, the fine angle $\theta_f$ represents the next 4 bits, and the very fine angle $\theta_{vf}$ represents the last 4 bits.

In the method, we look up the sine and cosine of the component angles, and then apply the following angle summation formulas to calculate the sine and cosine of the desired angle:

$$\sin\theta = \sin\theta_c\{\cos\theta_f\cos\theta_{vf} - \sin\theta_f\sin\theta_{vf}\} +$$
$$\cos\theta_c\{\sin\theta_f\cos\theta_{vf} + \cos\theta_f\sin\theta_{vf}\}$$
$$\cos\theta = \cos\theta_c\{\cos\theta_f\cos\theta_{vf} - \sin\theta_f\sin\theta_{vf}\} -$$
$$-\sin\theta_c\{\sin\theta_f\cos\theta_{vf} + \cos\theta_f\sin\theta_{vf}\}$$

After calculating the sine and cosine of the desired angle, it is multiplied by its respective window value, and the resulting coefficient is stored in a table.

Figure 5:
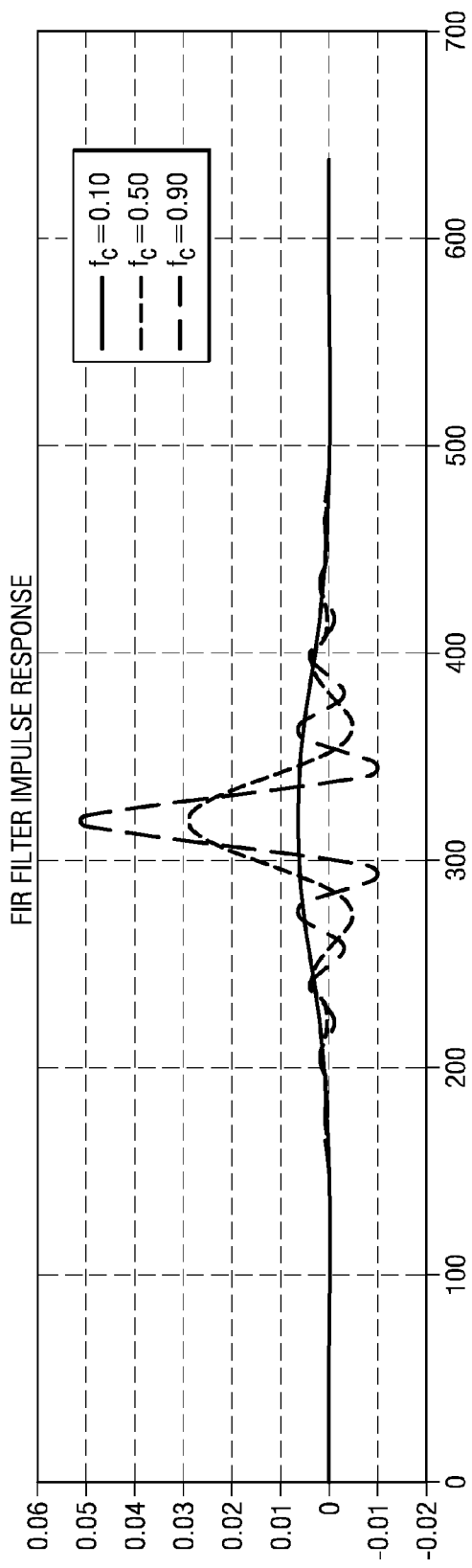
FIG. 5 illustrates frequency response.
Figure 5:
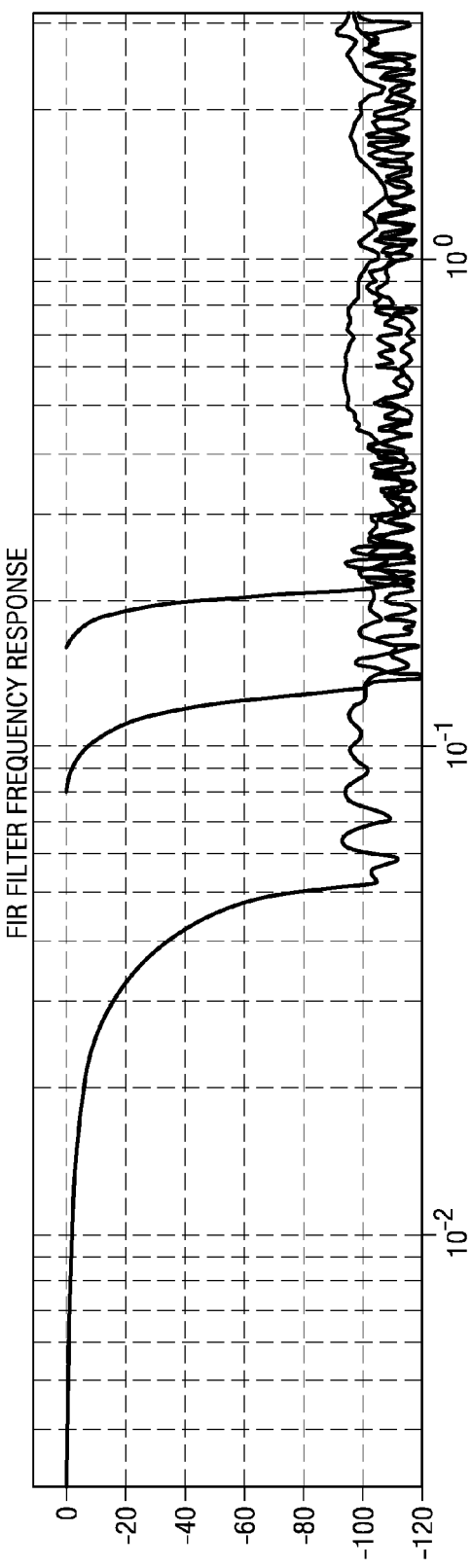

FIG. 5 shows filter frequency response plots for 3 different cutoff frequencies.

Alternative Ratio Estimator

An alternative preferred embodiment ratio estimator replaces the use of a hardware timer to determine the conversion ratio (i.e., by counting output bit clocks between input data frames). Instead, the alternative uses the input FIFO level as a feedback measurement for the ratio estimator. In particular, the new ratio is calculated according to:

$$r=r_0+K(n_a-n_d)$$

where $r_0$ is the nominal conversion ratio, $n_a$ is the actual FIFO level, $n_d$ is the desired FIFIO level, and K is a gain constant.

Figure 6:
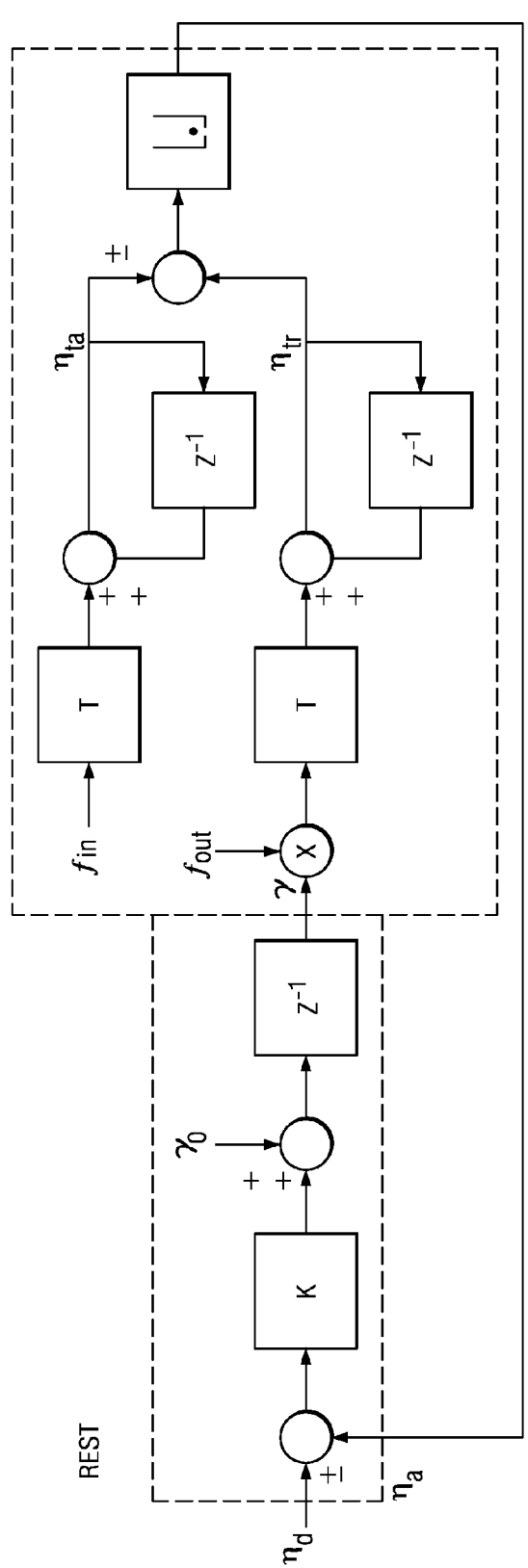
FIG. 6 is a ratio estimator block diagram.

FIG. 6 illustrates an implementation of the alternative ratio estimator with the following definitions: $f_{in}$ is the input sampling frequency, $f_{out}$ is the output sampling frequency, $n_a$ denotes the total number of samples in the IFIFO, $n_d$ denotes the desired (i.e., a target) number of samples in the IFIFO, $n_{ta}$ denotes the total number of samples added to the IFIFO, $n_{tr}$ denotes the total number of samples removed from the IFIFO, T is the ratio estimator update rate. K is the ratio estimator gain, r is the current ratio estimate, $r_0$ is the nominal ratio, and $\lfloor\ \rfloor$ denotes integer part. Thus during one time interval T, the number of input samples stored in the input FIFO is $f_{in}T$ and the number of samples removed from the input FIFO (i.e., no longer to be used in filterings) is $rf_{out}T$.

As the actual IFIFO level goes above the desired level, the conversion ratio is increased proportionally, causing the IFIFIO samples to be more rapidly consumed. Likewise, if the actual level goes below the desired level, the conversion ratio is decreased proportionally, causing IFIFO samples to be less rapidly consumed.

This alternative preferred embodiment ratio estimator avoids use of a timer for counting samples and directly controls the IFIFO level; this may allow for a smaller IFIFO.

ASRC Library Methods

The foregoing described preferred embodiment operations; whereas, the following illustrate a particular implementation's methods and their various calling parameters.

| Method | ASRC Create |
|---|---|
| Purpose | Instantiates an ASRC object |
| Prototype | ASRC_Handle ASRC_create ( |
| |     const IASRC_Fxns *fxns, |
| |     const ASRC_Params *prms |
| | ) |
| | typedef struct IASRC_Params { |
| |     Int size; |
| |     int istream_format; |
| |     int ififo_size; |
| | } IASRC_Params; |

Description:
This method instantiates the ASRC algorithm.
The first parameter is a pointer to a table of ASRC functions and is needed
to initialize the API. This is discussed in detail in the XDAIS documentation. The second is a pointer to the ASRC parameter record, which is defined in the prototype section above.
If the input stream format (istream_format) field in the parameter record is assigned a '0', data blocks are assumed to be in split buffer format. This means that each 2304 word data block will contain 1152 left samples followed by 1152 right samples. If the input stream format is assigned a '1', data blocks are assumed to be in interleaved format, meaning the first data word will be for the left channel, the second will be for the right channel, the third for the left, etc.
The second parameter, input FIFO size (ififo_size), defines the size in words of one channel of the input data buffer. To avoid buffer overruns, the input FIFO size should exceed the steady-state phase lag by a 10-20% margin. Since the steady-state phase lag is around 1400 samples throughout the ratio's range of variation, the IFIFO size should be at least 1500 samples. The 10-20% margin provides a cushion in case of a transient event following initialization. If ratio is greater than 1.19, it will be necessary to proportionally increase the size of the input FIFO.
When it executes, this method dynamically allocates space equal to
$n_{dyn} = 2642 + 2 \cdot n_{IFIFO}$
The method returns a handle to the algorithm instance needed for calling other methods.

| Method | Calculate interpolation coefficients |
|---|---|
| Purpose | Given a desired cutoff frequency, this method generates a table of FIR filter coefficients. |
| Prototype | void ASRC_calc_interp_coeff ( |
| |     ASRC_Handle handle, |
| |     int fc) |
| Execution Time (uS) | TBD |

Description:
This method calculates values for the FIR interpolator's coefficient bank based on calling parameters and is typically called shortly after the algorithm is instantiated. When calling, the application supplies the algorithm handle and a desired cutoff frequency for the interpolation filter, which ranges between 0 and 4096. A value of 4096 corresponds to half the
input sampling frequency, and a value of 0 in theory corresponds to a cutoff frequency of 0. For upsampling, a value 90% of 4096 is recommended to prevent imaging. For downsampling, a cutoff value of $$f_c = 0.90 \cdot 4096 \cdot \left\{\frac{f_{out}}{f_{in}}\right\}$$

is recommended to prevent aliasing. In the event of a sudden large change in input or output sampling rates, it will be necessary to call this subroutine to re-compute the interpolation filter coefficients.

| Method | Seed ratio estimator |
|---|---|
| Purpose | Supplies the REST with a starting estimate and based on this number, computes an starting output phase. |
| Prototype | void ASRC_seed_rest ( |
| |     ASRC_Handle handle, |
| |     long unsigned int rest_init |
| | ) |

Description:
Before beginning regular operation of the ASRC, the input FIFO must be filled. In addition, the ratio between the input and output sample frequency must either known apriori or determined from measurements. Once determined, this method is called to seed it. The method selects the compensator gain $K_p$ based on the linear gain schedule:

| Ratio Lower Bound | Ratio Upper Bound | Gain (/16384) |
|---|---|---|
| 0.00 | 0.42 | 5 |
| 0.42 | 0.51 | 6 |
| 0.51 | 0.60 | 7 |
| 0.60 | 0.68 | 8 |
| 0.68 | 0.77 | 9 |
| 0.77 | 0.85 | 10 |
| 0.85 | 0.94 | 11 |
| 0.94 | 1.02 | 12 |
| 1.02 | 1.11 | 13 |
| 1.11 | 1.19 | 14 |
| 1.119 | Infinity | 15 |

This keeps the phase error around 1400 samples throughout the operating range of the converter.
After the gain is selected, the initial output phase is computed by the formula $$\phi_{out} = \phi_{in} - \frac{\hat{r}}{K_p}$$

in order to minimize transient response. The rest_init parameter is in Q16 format, with 65536 corresponding to a value of 1.0.

| Method | Update ratio estimator |
|---|---|
| Purpose | Updates the ratio estimator based on the current value of the input and output phases. |
| Prototype | long int ASRC_update_rest ( |
| |     ASRC_Handle handle |
| | ) |
| Execution Time (uS) | TBD |

Description:
Uses the control law $$\phi_{err} = \phi_{in} - \phi_{out}$$

$$\hat{r}_{n+1} = K_p\left(\frac{T_{bin}}{T_{bin}+\tau}\right)\phi_{err} + \left(\frac{\tau}{T_{bin}+\tau}\right)\hat{r}_n$$

to compute the latest ratio estimate. This method is called during operation for each input block arrival and returns the newly calculated ratio estimate.
This can be used by the application program for monitoring purposes.

| Method | Update input FIFO |
|---|---|
| Purpose | Enters the current data block into the input FIFO and updates the input phase |
| Prototype | void ASRC_update_ififo ( |
| |     ASRC_Handle handle, |
| |     int *istream |
| | ) |
| Execution Time (uS) | TBD |

Description:
Using the block pointer (istream) supplied by the application, this method copies an input block of size 2304 to the input FIFO. Once the data has been entered, the input phase is advanced by the quantity 65536 · 1152. During operation, this method is generally called first, prior to updating the ratio estimator.

| Method | ASRC generate output block |
|---|---|
| Purpose | Generates a batch of output samples, updates output phase |
| Prototype | void ASRC_gen_output_block ( |
| |     IASRC_Handle handle, |
| |     int *out_ptr, |
| |     unsigned int elem_xmit_last_block |
| | ) |

-continued

| | |
|---|---|
| Execution Time (uS) per 1000 Samples | TBD |

Description:
Generates a batch of output samples of size elem_xmit_last_block. This block is copied into an output buffer whose base address is specified by the parameter out_ptr. The output samples are in interleaved format, with successive words alternating between left and right channels. After the batch generation is completed, the output phase is advanced by the amount $\phi_{out,n+1} = \phi_{out,n} + \hat{r}_n n_{bout}$ where $n_{bout}$ is the size of the output batch. This method is called during operation after the ratio estimate has been updated.

| | |
|---|---|
| Method | Delete ASRC |
| Purpose | Deletes the instance. |
| Prototype | void ASRC_delete( ASRC_Handle handle ) |

Description:
As suggested by its name, this method deletes the instance. It frees
$n_{dyn} = 2642 + 2 \cdot n_{IFIFO}$
words of memory which were originally allocated during the instance creation.

Sample Application Program

Figure 8:
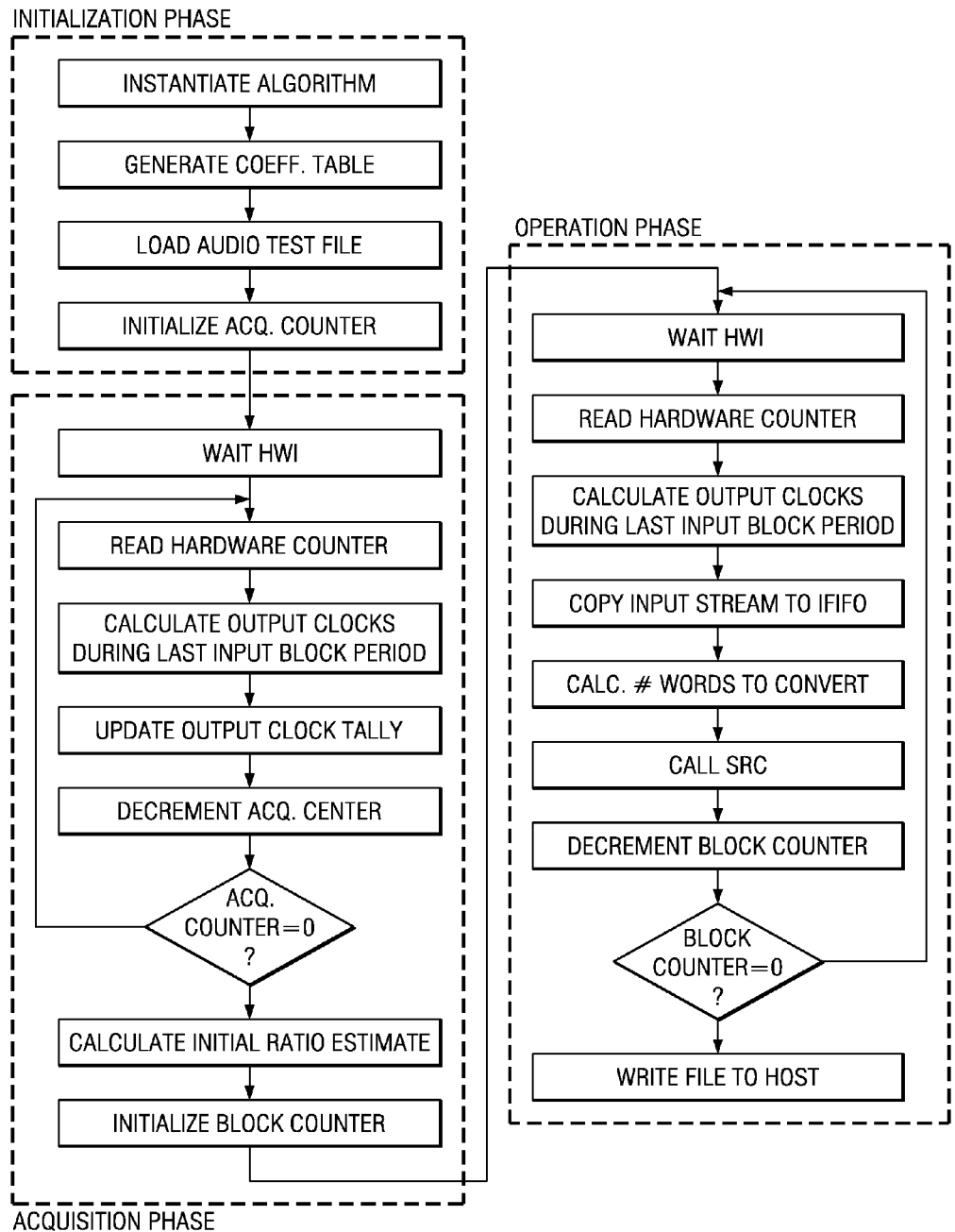
FIG. 8 is a flow diagram.

FIG. 8 is a flowchart illustrating three phases of the implementation: an initialization phase, an acquisition phase, and an operating phase. During the initialization phase, methods are called to instantiate the converter and calculate the FIR filter coefficients. Then the listening material is loaded into the input stream buffer. Next, the counter is initialized, and the input block interrupts are enabled.

In the acquisition phase, the input FIFO is filled, and the output clocks are counted over a fixed number of input block periods. After the acquisition phase is completed, the application divides the number of input bits "received" by the number of output bits "transmitted" to obtain an initial ratio estimate. The ratio estimator is seeded with this value.

Figure 7:
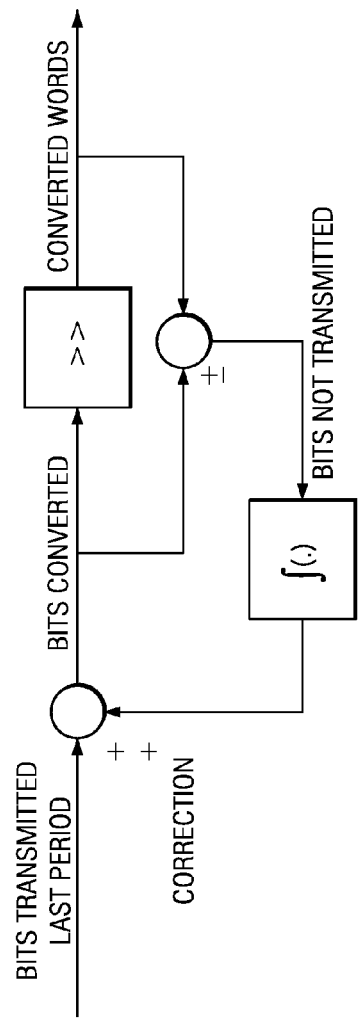
FIG. 7 shows dithering.

After seeding the REST, the application enters the operating phase. As in the acquisition phase, every time an input block is received, it is copied from the input stream to the input FIFO, and the ratio estimator is updated. Next, the application computes the number of words to convert. As shown in FIG. 7, this is based on the number of bits transmitted during the last block period and the integral of bits not transmitted over prior block periods. This dithering is done to reduce the effect of the bit-to-word quantization noise on the ratio estimator. Next, the interpolator is called, and the output sample batch is copied from a local buffer to the output stream. After the entire input stream has been converted, the application disables further interrupts, and writes the output stream back to the DSP.

Performance Measurements

The performance of an ASRC implementation was evaluated for several important input/output sample frequency combinations. For each combination (test case), six pure tones were generated in Matlab with full-scale amplitude. Each input waveform was uploaded to the input stream buffer on the DSP, processed in real-time by the ASRC, and the output waveform was recorded on the PC. Each output waveform was loaded into Matlab, and a Kaiser window was applied to the waveform prior to FFT analysis, which was used to measure the SNR of the output waveform.

The SNR data which follows is for a previous FIR interpolator which only had 16 phases. The current interpolation has 32 phases, and the SNR numbers generally show a 4–8 dB improvement at the 2 highest test frequencies.

| Input Freq. (Hz) | SNR (dB) |
|---|---|
| Test Case #1: 24.00 to 24.01 kHz | |
| 20.8 | 107 |
| 83.3 | 100 |
| 333.3 | 95 |
| 1333.3 | 93 |
| 2666.6 | 87 |
| 5333.3 | 82 |
| Test Case #2: 24.00 to 42.1875 kHz | |
| 20.8 | 99 |
| 83.3 | 98 |
| 333.3 | 98 |
| 1333.3 | 94 |
| 2666.6 | 92 |
| 5333.3 | 92 |
| Test Case #3: 24.00 to 44.1 kHz | |
| 20.8 | 100 |
| 83.3 | 99 |
| 333.3 | 98 |
| 1333.3 | 93 |
| 2666.6 | 90 |
| 5333.3 | 82 |
| Test Case #4: 24.00 to 48.0 kHz | |
| 20.8 | 94 |
| 83.3 | 92 |
| 333.3 | 92 |
| 1333.3 | 89 |
| 2666.6 | 88 |
| 5333.3 | 86 |
| Test Case #5: 44.1 to 24.0 kHz | |
| 38.3 | 89 |
| 153.1 | 89 |
| 612.5 | 89 |
| 2450 | 91 |
| 7350 | 90 |
| 14700 | Rolled Off |
| Test Case #6: 44.1 to 42.1875 kHz | |
| 38.3 | 99 |
| 153.1 | 99 |
| 612.5 | 98 |
| 2450 | 93 |
| 7350 | 84 |
| 14700 | 82 |
| Test Case #7: 44.1 to 48.0 kHz | |
| 38.3 | 100 |
| 153.1 | 98 |
| 612.5 | 97 |
| 2450 | 93 |
| 7350 | 88 |
| 14700 | 95 |
| Test Case #8: 48.0 to 24.0 kHz | |
| 41.7 | 104 |
| 166.7 | 103 |
| 666.7 | 97 |
| 2666.7 | 97 |
| 8000 | 87 |
| 16000 | Rolled Off |
| Test Case #9: 48.0 to 42.1875 kHz | |
| 41.7 | 98 |
| 166.7 | 99 |
| 666.7 | 101 |
| 2666.7 | 96 |
| 8000 | 88 |
| 16000 | 81 |
| Test Case #10: 48.0 to 44.1 kHz | |
| 41.7 | 99 |
| 166.7 | 98 |
| 666.7 | 98 |

-continued

| Input Freq. (Hz) | SNR (dB) |
|---|---|
| 2666.7 | 96 |
| 8000 | 88 |
| 16000 | 82 |

What is claimed is:

1. A method of sampling rate conversion, comprising the steps of:
   (a) storing a block of input samples in an input FIFO, said input samples associated with an input sampling rate;
   (b) updating an input phase by the size of said block of input samples;
   (c) updating an estimate of a ratio of said input sampling rate divided by an output sampling rate;
   (d) determining the number of output samples needed to fill an output FIFO, said output FIFO emptied according to said output sampling rate;
   (e) computing output samples according to the results of step (d), said computing by filtering contents of said input FIFO;
   (f) storing said output samples from step (e) in said output FIFO;
   (g) updating an output phase by the product of said number of output samples needed multiplied by said estimate of a ratio; and
   (h) repeating steps (a)-(g).

2. The method of claim 1, wherein said updating an estimate of a ratio is by an autoregression with inhomogeneous term proportional to the difference of said input phase minus said output phase.

3. The method of claim 2, wherein said autoregression is:

$$r(n+1)=(1s)r(n)+sK \text{ (input phase output phase)}$$

where r(n) is said estimate of a ratio, r(n+1) is said update of r(n), K is a gain factor, and s is a number in the range between 0 and 1.

4. The method of claim 1, wherein said updating an estimate of a ratio is by incrementing said estimate of a ratio with the product of a gain multiplied by the difference of a target number of samples for said input FIFO minus the number of samples in said input FIFO.

5. The method of claim 4, wherein said number of samples in said input FIFO is computed as the total number of samples added to said input FIFO minus the total number of samples removed from said input FIFO.

6. An asynchronous sampling rate converter, comprising:
   (a) an input FIFO for input blocks of samples associated with an input sampling rate;
   (b) an output FIFO for computed output samples associated with an output sampling rate;
   (c) a ratio estimator, said ratio estimator estimating a ratio of said input sampling rate divided by said output sampling rate using an autoregression with inhomogeneous term proportional to a difference of an input phase for samples in said input FIFO and an output phase for samples in said output FIFO; and
   (d) an interpolator coupled to said input FIFO, to said output FIFO, and to said ratio estimator, said interpolator computing output samples to fill said output FIFO using contents of said input FIFO when said input FIFO receives an input block of samples.

7. The converter of claim 6, wherein the ratio estimator and interpolator are implemented as programs on a programmable processor.

* * * * *